United States Patent
O'Connell et al.

(10) Patent No.: US 7,741,190 B2
(45) Date of Patent: Jun. 22, 2010

(54) METHOD OF SELECTIVE OXYGEN IMPLANTATION TO DIELECTRICALLY ISOLATE SEMICONDUCTOR DEVICES USING NO EXTRA MASKS

(75) Inventors: Denis Finbarr O'Connell, Palo Alto, CA (US); Ann Margaret Concannon, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 31 days.

(21) Appl. No.: 11/891,170

(22) Filed: Aug. 9, 2007

(65) Prior Publication Data

US 2009/0042357 A1  Feb. 12, 2009

(51) Int. Cl.
*H01L 21/76* (2006.01)
(52) U.S. Cl. .................................. 438/407; 257/347
(58) Field of Classification Search ............. 438/221, 438/407, 296, 369, 439, 440; 257/347, 350, 257/351, 369
See application file for complete search history.

(56) References Cited

U.S. PATENT DOCUMENTS

| 4,975,126 | A | | 12/1990 | Margail et al. ............. 145/33.2 |
| 5,346,841 | A | * | 9/1994 | Yajima ....................... 438/295 |
| 5,488,004 | A | | 1/1996 | Yang ............................ 437/35 |
| 6,074,929 | A | * | 6/2000 | Thomas ...................... 438/407 |
| 6,475,868 | B1 | * | 11/2002 | Hao et al. ................... 438/301 |
| 2002/0033510 | A1 | * | 3/2002 | Tomita ....................... 257/372 |
| 2005/0280084 | A1 | * | 12/2005 | Morishita et al. .......... 257/338 |

* cited by examiner

*Primary Examiner*—Steven Loke
*Assistant Examiner*—Kimberly M Thomas
(74) *Attorney, Agent, or Firm*—Dergosits & Noah LLP

(57) ABSTRACT

A method of fabricating integrated circuit structures utilizes selective oxygen implantation to dielectrically isolate semiconductor structures using no extra masks. Existing masks are utilized to introduce oxygen into bulk silicon with subsequent thermal oxide growth. Since the method uses bulk silicon, it is cheaper than silicon-on-insulator (SOI) techniques. It also results in bulk-silicon that is latch-up immune.

5 Claims, 3 Drawing Sheets

METHOD OF SELECTIVE OXYGEN IMPLANTATION TO DIELECTRICALLY ISOLATE SEMICONDUCTOR DEVICES USING NO EXTRA MASKS

FIELD OF THE INVENTION

The present invention relates to integrated circuits and, in particular, to integrated circuit fabrication techniques that use existing masks to dielectrically isolate semiconductor devices using oxygen implantation and subsequent thermal oxide growth.

DISCUSSION OF THE RELATED ART

FIG. 1 shows a conventional bulk CMOS structure 100 that includes a p-channel MOS transistor 102 formed in a P-type crystalline silicon (bulk) substrate 104 and an n-channel MOS transistor 106 formed in an N-well 108 that is formed in the bulk silicon 104. Bulk CMOS structures of this type are widely utilized in a large number of integrated circuit applications.

Referring to FIG. 2, a by-product of the conventional bulk CMOS structure 100 shown in FIG. 1 is a pair of parasitic bipolar junction transistors (BJT) Q1 and Q2. The collector of each parasitic BJT is connected to the base of the other BJT in a positive feedback structure. A phenomenon called "latch-up" can occur when both BJT Q1 and BJT Q2 conduct, creating a low resistance path between Vdd and GND, and the product of the gains (Beta) of the two BJTs (Q1 and Q2) in the feedback loop is greater than one. The result of latch-up is, at a minimum, a circuit malfunction and, in the worst case, the destruction of the device.

One way to prevent latch-up in these structures is to move the N-well 108 and the n+ source/drain regions of the p-channel device 102 farther apart. This increases the width of the base of parasitic transistor Q2 and reduces Beta. Unfortunately, this approach also reduces circuit density, resulting in a larger die size.

Another approach to preventing latch-up in CMOS circuit structures is to utilize silicon-on-insulator (SOI) technology. SOI refers to the use of a layered silicon-insulator-silicon substrate in place of the bulk silicon approach discussed above. That is, in an SOI-based device, the silicon junctions of the n-channel device and the p-channel device are built above a layer of electrical insulator, typically silicon dioxide, that separates these devices from the bulk silicon substrate. One of the benefits of SOI technology relative to conventional bulk CMOS processing is a resistance to the latch-up phenomenon due to complete electrical isolation of the N-well and P-substrate structures.

U.S. Pat. No. 4,975,126, issued on Dec. 4, 1990, is an example of a publication that discloses techniques, including the well known SIMOX process, for forming SOI structures by implanting oxygen ions beneath the surface of a bulk silicon substrate, followed by a subsequent high temperature annealing step to form a buried layer of silicon dioxide.

A drawback of SOI-based technologies is the relatively high cost required to fabricate the SOI structure.

SUMMARY OF THE INVENTION

The present invention provides a method of forming isolation dielectric for an integrated circuit structure. In general, the method comprises forming a mask over a silicon substrate, using the mask to implant oxygen into a the substrate, using the same mask to perform a further step in the integrated circuit fabrication process, and then performing a subsequent thermal step to cause the implanted oxygen to react to form a silicon oxide isolation structure.

In one embodiment of the invention, the general method is used to provide isolation dielectric for a bulk silicon CMOS circuit structure. In this particular embodiment, the oxygen implant is performed prior to formation of the CMOS circuit's buried layer using the buried layer mask, thereby avoiding the need for a high energy oxygen implant. The implanted oxygen is converted to isolating silicon oxide in the buried layer thermal anneal drive step. The isolation of the subsequently formed CMOS active device regions can be completed with the formation of a deep trench isolation structure. If the technology in use does not include deep trench isolation, then isolation can be achieved using suitable oxygen implant techniques, such as tilt implant, in combination with other isolation techniques if needed. Formation of a dielectric isolation structure for a bulk CMOS circuit in accordance with the concepts of the invention provides latch-up immunity for the circuit.

The features and advantages of the various aspects of the present invention will be more fully understood and appreciated upon consideration of the following detailed description of the invention and the accompanying drawings, which set forth an illustrative embodiment in which the concepts of the invention are utilized.

DETAILED DESCRIPTION OF THE INVENTION

The present invention provides a method of selective oxygen implantation into a silicon substrate to electrically isolate semiconductor devices using existing masks.

Figure 1:
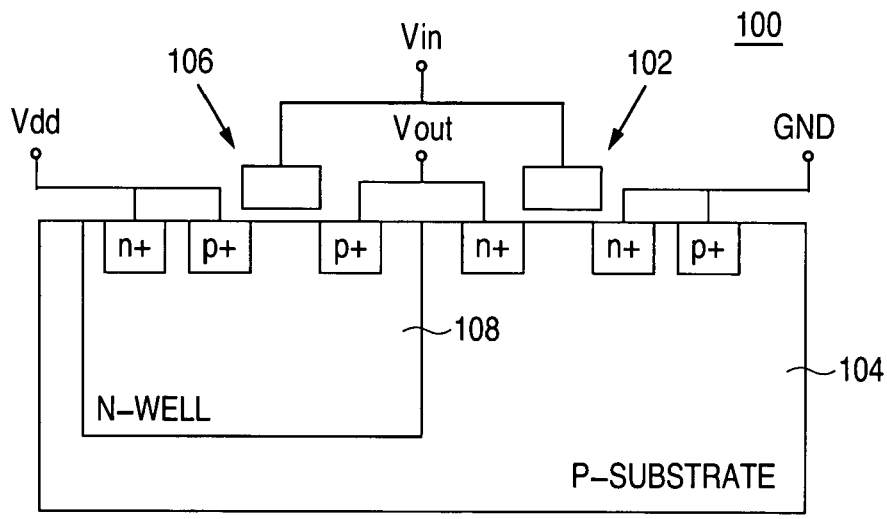
FIG. 1 is a partial cross section drawing illustrating a conventional bulk CMOS structure.
Figure 2:
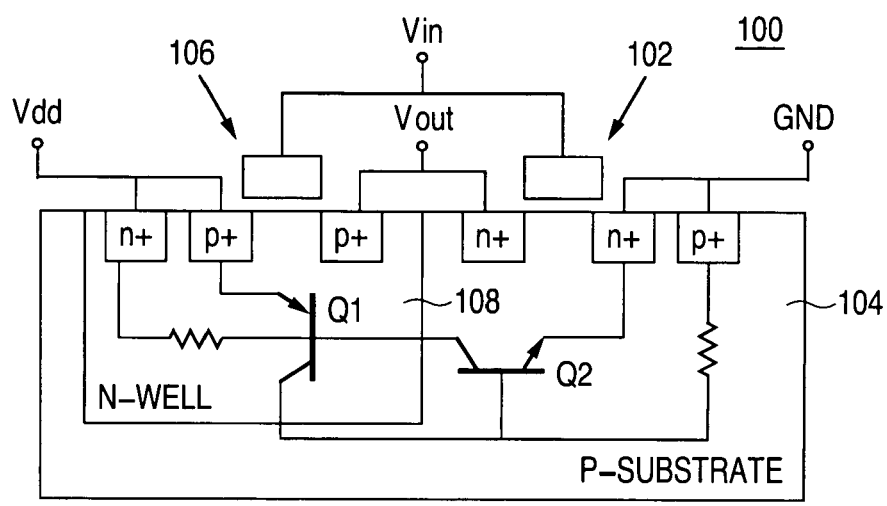
FIG. 2 is a partial cross section drawing illustrating the parasitic bipolar junction transistors inherent in the FIG. 1 bulk CMOS structure.
Figure 3A:
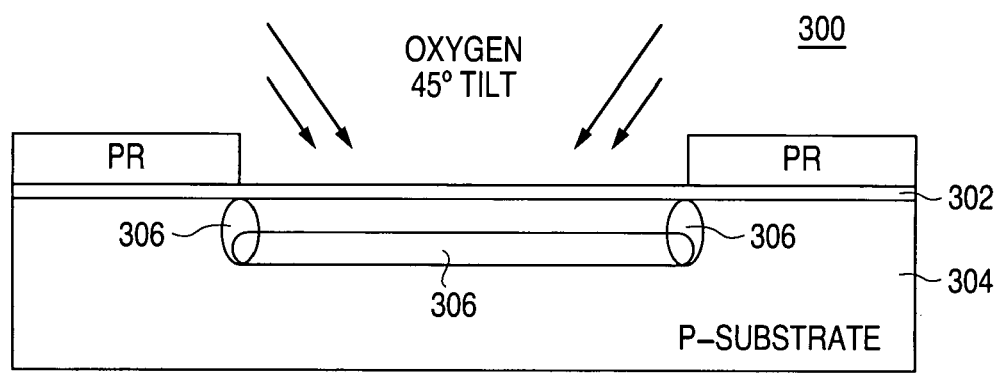
FIGS. 3A-3C are partial cross section drawings illustrating a sequence of process steps for fabricating a dielectrically isolated CMOS structure on accordance with the oxygen implant concepts of the present invention.

More specifically, with reference to FIG. 3A, in the course of a process flow for the fabrication of an integrated circuit structure 300, a layer of screening oxide 302 may be formed on a crystalline silicon substrate 304, shown in FIG. 3A as a P-type silicon substrate. Those skilled in the art will appreciate that the screening oxide may not be required in some circuit applications. In accordance with well known photolithographic techniques, a layer of photoresist is then formed on the screening oxide 302 over the silicon substrate 304 and patterned to provide a photoresist mask PR that exposes an upper surface area of the screening oxide 302. Oxygen ions are then implanted through the screening oxide 302 and into the silicon substrate 304 beneath the upper surface of the silicon substrate 304 to provide an oxygen ion implant region 306 that defines a volume 307 of the silicon substrate 304 beneath the opening in the mask PR. FIG. 3A shows the use of a 45° tilt implant to define both the sidewalls and lower level of the oxygen implant region 306, although those skilled in the art will appreciate that any number of well known implant techniques can be utilized to form the implant region 306. For example, a 90° oxygen implant would ultimately result in a layer of silicon oxide beneath the surface of the substrate 304 that, in conjunction with subsequent formation of deep trench isolation, would provide the same final dielectric isolation structure.

Figure 3B:
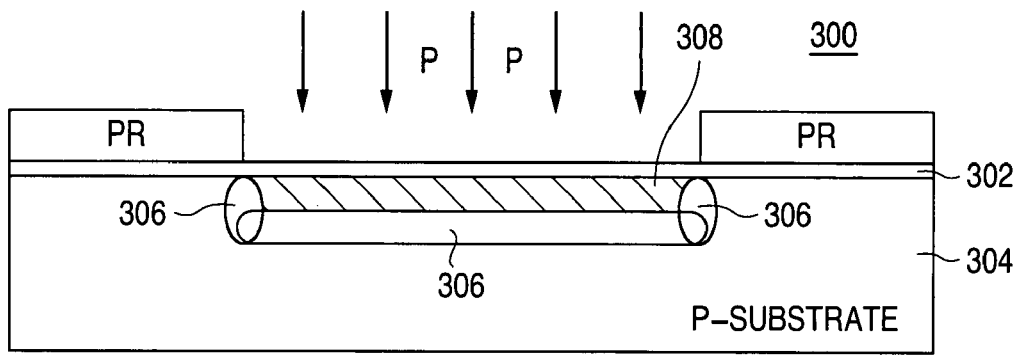

In accordance with the concepts of the present invention, the photoresist mask PR utilized for introduction of the oxygen into the selected regions 306 of the silicon substrate 304 is also utilized to perform additional fabrication steps for the integrated circuit structure 300. For example, as shown in FIG. 3B, the photoresist mask PR may be utilized to introduce p-type dopant into the silicon substrate 304 beneath the exposed upper surface regions of the screening oxide 302 to form a p-type buried layer 308 in the silicon substrate 304 above the oxygen implant regions 306.

Figure 3C:
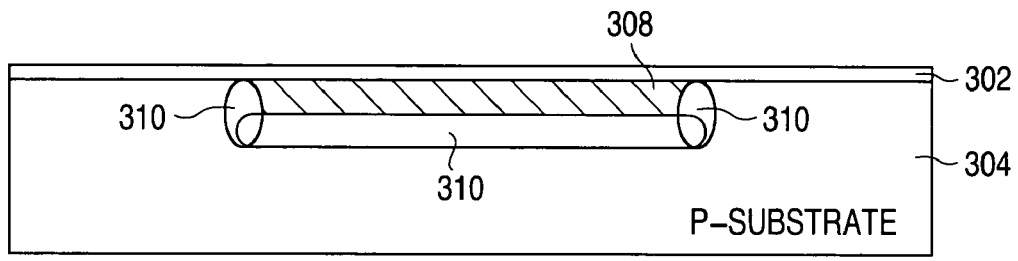

With reference to FIG. 3C, a thermal step, such as a thermal step to anneal the p-type buried layer 308, results in a reaction between the implanted oxygen 306 and the surrounding substrate silicon to provide silicon dioxide 310 that electrically isolates the buried layer 308 from the bulk silicon 304.

Those skilled in the art will appreciate that processing of the integrated circuit structure can then proceed in accordance with well known techniques to complete a desired final integrated circuit structure.

As discussed above, the concepts of the present invention are most applicable and easy to implement in the case of integrated circuit technologies that utilized buried layers, deep trench isolation and/or epitaxial silicon growth. For example, as stated above, the oxygen can be implanted into the substrate silicon using the buried layer mask before the buried layer implant, thus not requiring very high energy for the oxygen implant. By subsequent oxidation, a completely isolated device region can be achieved when the deep trench isolation meets the oxide.

Figure 4:
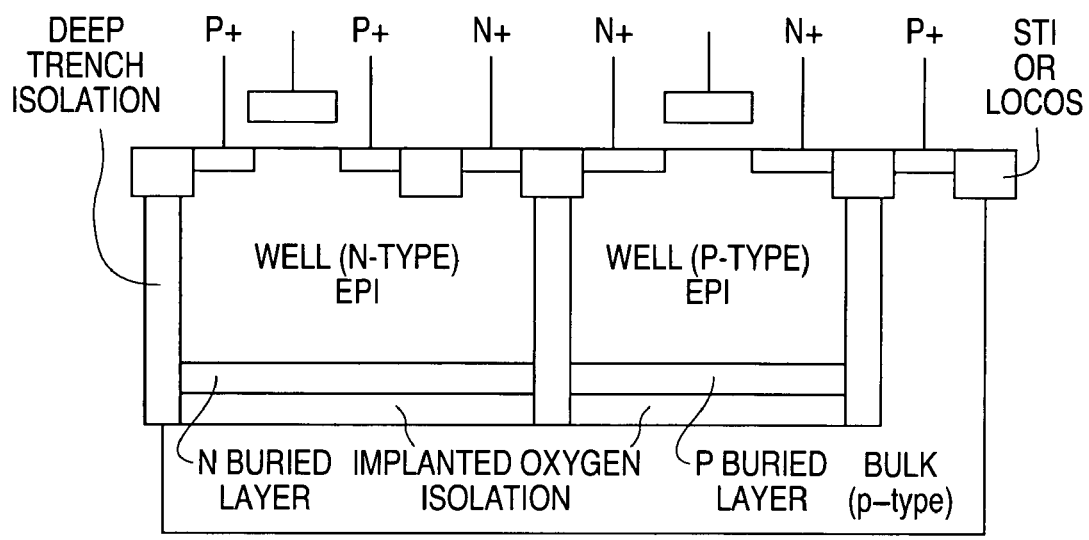
FIG. 4 is a partial cross section drawing illustrating a bulk silicon structure with buried layers, epitaxial and deep trench isolation with fully dielectrically isolated devices in accordance with the concepts of the present invention.

FIG. 4 shows an example of how the implanted oxygen buried layer might look in a final CMOS device structure when applied to a technology that includes deep trench isolation. In this case, the oxygen implant mask is the buried layer mask. The oxygen implant is performed prior to the buried layer implant. The oxidation of the implanted oxygen to form silicon dioxide occurs at the same time as the buried layer thermal anneal drive step. This process is easily done since, as stated above, it does not require high energy oxygen implantation. This is because deposition of the epitaxial layer follows buried layer processing; thus, at the time of the oxygen implant, there is no epitaxial layer in place.

Figure 5:
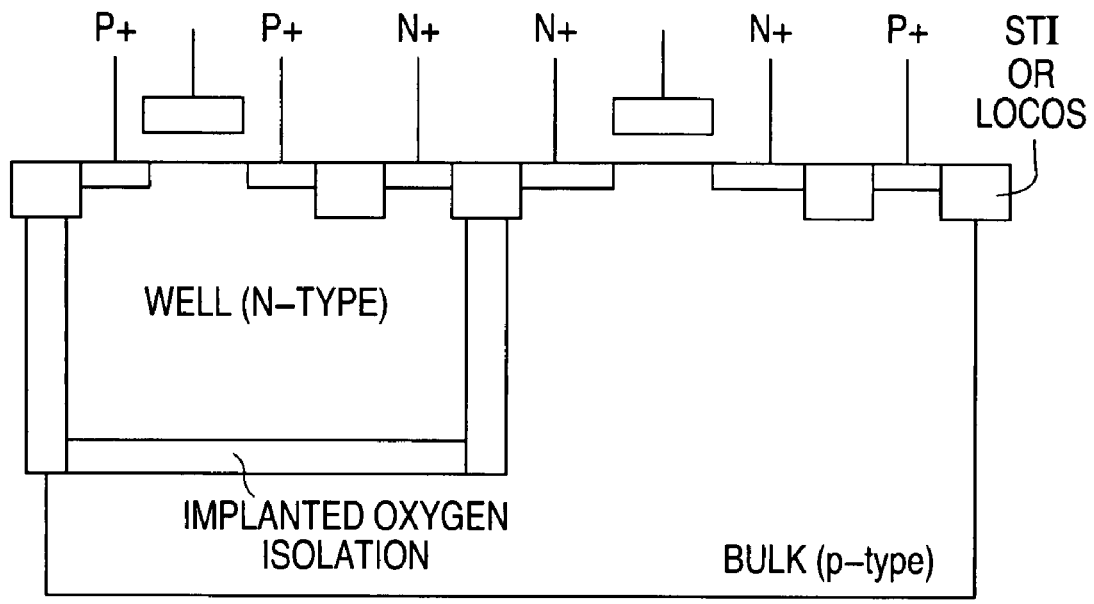
FIG. 5 is a partial cross section drawing illustrating a bulk silicon structure with no deep trench isolation, but with fully dielectrically isolated devices in accordance with the concepts of the present invention.

With reference to FIG. 5, for bulk silicon technologies with no deep trench isolation, the implementation of the concepts of the invention is a bit more difficult. If the bulk is p-type silicon, then the PMOS transistors in the N-well can be dielectrically isolated from the p-type bulk silicon by selective deep implantation of oxygen into the N-well region prior to n-well implant followed by an oxidation anneal, thus growing on oxide layer at the bottom of the N-well. The N-well mask is used as the same mask as the oxygen implantation, thereby requiring no extra masks. Depending upon the depth of the local isolation (STI or LOCOS), the angle of the oxygen implant can be adjusted, or quad implants can be performed, in order to totally isolate the N-well from the P-well. The oxygen implantation in this case is required to be high energy, requiring the well mask to block the high energy implant where it is not required. This could require either thick resist or the use of a hard mask, both of which are commonly utilized process tools.

Figure 6:
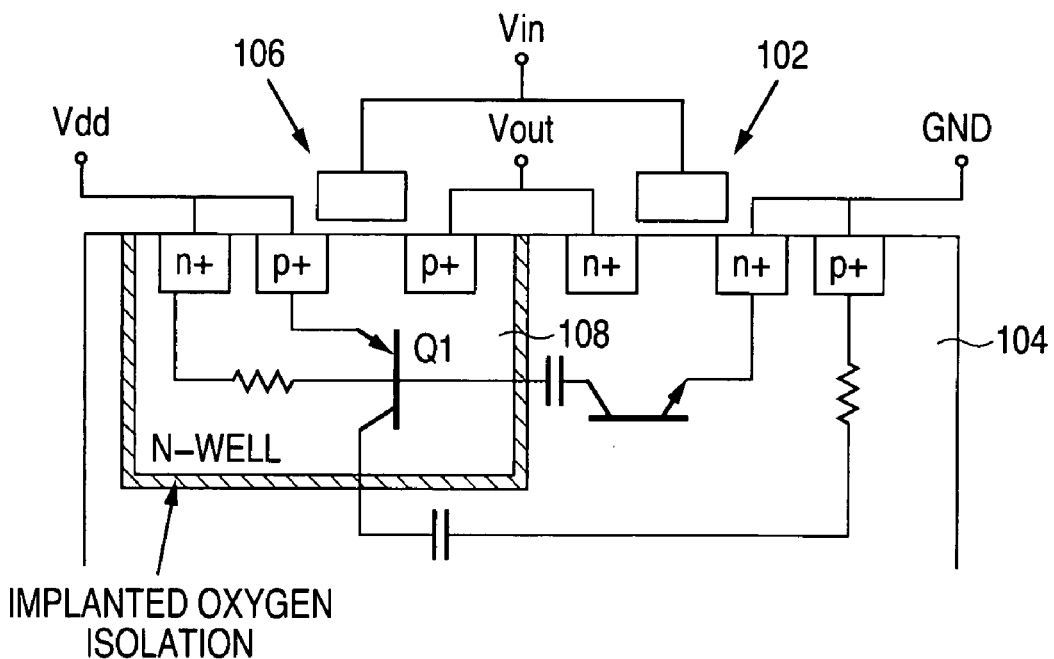
FIG. 6 is a partial cross section drawing illustrating latch-up prevention in bulk CMOS structures in accordance with the concepts of the present invention.

Referring to FIG. 6, by the presence of the implanted oxygen isolation oxide, the possibility of circuit latch-up is removed due to the removal of the bipolar devices required for latch-up. As further shown in FIG. 6, the utilization of the oxide isolation techniques of the present invention also affords circuit designers the use of another capacitor that is formed by the buried dielectric.

It should be understood that the particular embodiments of the invention described above have been provided by way of example and that other modifications may occur to those skilled in the art without departing from the scope and spirit of the invention as express in the appended claims and their equivalents.

What is claimed:

1. A method of fabricating isolation dielectric in an integrated circuit structure, the method comprising:
    forming a patterned mask over a p-type silicon substrate;
    using the patterned mask to implant oxygen in a selected region of the silicon substrate, the selected region having a lower layer that extends beneath an upper surface of the silicon substrate and sidewall layers that extend from the lower layer to the upper surface of the silicon substrate to define a volume region of the silicon substrate;
    using the patterned mask to introduce dopant into the defined volume of the silicon substrate;
    performing a thermal step that causes the lower layer and sidewalls of the selected region into which oxygen has been implanted to react to form silicon oxide that electrically isolates the defined volume region of the silicon substrate;
    forming a well of n-type conductivity in the defined volume of the silicon substrate;
    forming a PMOS device structure in the n-type well; and
    forming a NMOS device structure in a region of the silicon substrate that is not a part of the defined volume.

2. The method of claim 1, wherein the oxygen is introduced into the selected region of the silicon substrate by implanting the oxygen at an angle relative to the upper surface of the silicon substrate that is about 90 degrees.

3. The method of claim 1, wherein the oxygen is implanted into the selected region of the silicon substrate by implanting the oxygen at an angle relative to the upper surface of the silicon substrate that is less than 90 degrees.

4. The method of claim 1, wherein the oxygen is introduced into the selected region of the silicon substrate by implanting the oxygen at an angle relative to the upper surface of the silicon substrate that is about 45 degrees.

5. A method as in claim 1, and further comprising:
    forming an electrical interconnect structure between the PMOS device structure and the NMOS device structure to define a CMOS device structure.

* * * * *